United States Patent
Nakadate et al.

(10) Patent No.: US 9,317,648 B2
(45) Date of Patent: Apr. 19, 2016

(54) CIRCUIT BOARD DESIGN AND CORRECTION METHOD DETERMINING A DIFFERENCE BETWEEN GROUPINGS OF LAYERS

(71) Applicant: FUJITSU LIMITED, Kawasaki-shi, Kanagawa (JP)

(72) Inventors: Mami Nakadate, Yokohama (JP); Tetsuyuki Kubota, London (GB); Shigeo Ishikawa, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 73 days.

(21) Appl. No.: 14/247,405

(22) Filed: Apr. 8, 2014

(65) Prior Publication Data

US 2014/0310677 A1 Oct. 16, 2014

(30) Foreign Application Priority Data

Apr. 12, 2013 (JP) .................................. 2013-084194

(51) Int. Cl.
G06F 17/50 (2006.01)

(52) U.S. Cl.
CPC ........ G06F 17/5081 (2013.01); G06F 17/5068 (2013.01)

(58) Field of Classification Search
CPC .................................................. G06F 17/5068
USPC ................................. 716/136–137, 126, 130
See application file for complete search history.

(56) References Cited

U.S. PATENT DOCUMENTS

| | | | | |
|---|---|---|---|---|
| 7,139,678 B2 * | 11/2006 | Kobayashi | .......... | G06F 17/5018 702/136 |
| 7,409,667 B1 * | 8/2008 | Pritchard | ............ | G06F 17/5068 716/102 |
| 8,219,954 B2 * | 7/2012 | Kobayashi | .......... | G06F 17/5068 703/16 |
| 2002/0144228 A1 | 10/2002 | Uchida et al. | | |
| 2005/0008319 A1 * | 1/2005 | Cameron | ................ | G06F 17/50 385/145 |
| 2008/0189080 A1 * | 8/2008 | Tenma | .................... | G06F 17/50 703/1 |
| 2009/0276164 A1 | 11/2009 | Hirata | | |
| 2010/0138799 A1 * | 6/2010 | Matsushita | ......... | G06F 17/5081 716/136 |
| 2010/0138800 A1 * | 6/2010 | Kobayashi | .......... | G06F 17/5068 716/115 |
| 2011/0208485 A1 * | 8/2011 | Itoh | ..................... | G06F 17/5018 703/1 |
| 2013/0152037 A1 * | 6/2013 | He | ...................... | G06F 17/5068 716/136 |
| 2013/0326444 A1 * | 12/2013 | Orita | ................... | G06F 17/5068 716/111 |
| 2014/0268603 A1 * | 9/2014 | Hoffmeyer | .......... | G06F 17/5072 361/760 |
| 2015/0195901 A1 * | 7/2015 | Hoffmeyer | .......... | G06F 17/5072 361/760 |

FOREIGN PATENT DOCUMENTS

| | | |
|---|---|---|
| JP | 2005-190206 | 7/2005 |
| WO | 01/50356 | 7/2001 |
| WO | 2008/001922 | 3/2008 |

* cited by examiner

*Primary Examiner* — Stacy Whitmore

(74) *Attorney, Agent, or Firm* — Staas & Halsey LLP

(57) ABSTRACT

A board design aid device includes a calculating and correcting units. The calculating unit groups a plurality of layers in a multi-layer board into a plurality of pairs of layers based on design information of the multi-layer board, the plurality of layers being stacked and derives a difference of total amounts in respect to a board design element, each of the total amounts being related to each layer of a pair of layers of the plurality of pairs of layers, the board design element being related to a warp of the multi-layer board. The correcting units, based on the difference of the total amounts, corrects an amount of the board design element for at least one of layers among at least one of the plurality of the pairs of layers so that the difference of the total amounts of the board design element is maintained within a certain range.

20 Claims, 18 Drawing Sheets

FIG. 20

|  | Type 1 | Type 2 | Type 3 | Type 4 | Type 5 | Type 6 | Type 7 |
|---|---|---|---|---|---|---|---|
| L1-L2 | 10598 | 17967 | 11096 | 12168 | 12946 | 7864 | 9100 |
| L2-L3 | 10620 | 16851 | 10356 | 11700 | 12082 | 6776 | 9436 |
| L3-L4 | 8798 | 13389 | 9534 | 11198 | 11760 | 5706 | 8168 |
| L4-L5 | 7958 | 12039 | 8982 | 10376 | 10410 | 5160 | 8044 |
| L5-L6 | 7482 | 11487 | 8742 | 10226 | 9744 | 4364 | 8120 |
| L6-L7 | 7836 | 11628 | 8414 | 10216 | 10336 | 3664 | 8276 |
| L7-L8 | 7700 | 11556 | 8644 | 10060 | 9852 | 3086 | 7840 |
| L8-L9 | 7612 | 11265 | 9964 | 10354 | 9088 | 3652 | 8752 |
| L9-L10 | 7440 | 11910 | 8966 | 9576 | 7678 | 3742 | 9856 |
| VIA DIFFERENCE (INTERNAL) | 7386 | 13887 | 3980 | 5236 | 10244 | 11362 | 24 |
| VIA DIFFERENCE (SURFACE) | 3158 | 6057 | 2130 | 2592 | 5268 | 4122 | -756 |

CIRCUIT BOARD DESIGN AND CORRECTION METHOD DETERMINING A DIFFERENCE BETWEEN GROUPINGS OF LAYERS

CROSS-REFERENCE TO RELATED APPLICATION

This application is based upon and claims the benefit of priority of the prior Japanese Patent Application No. 2013-084194, filed on Apr. 12, 2013, the entire contents of which are incorporated herein by reference.

FIELD

The embodiments discussed herein relate to a board design aid device, board design aid method, and board design aid program.

BACKGROUND

Designing of circuit boards such as printed boards is generally conducted through the use of a graphic processing system such as a computer aided design (CAD) system. The arrangement of wiring and the like is determined in consideration of the location and size of components mounted on the circuit board when designing circuit boards. A circuit board is manufactured by using information of the circuit board that is designed with a graphic processing system. The components are mounted on the circuit board to complete a device that includes the circuit board and the components.

However, a high degree of flatness is expected for manufactured circuit boards in order to reduce, for example, connection failures when mounting the components on the circuit board. Moreover, the device that includes the components and the circuit board is installed in a product. A high degree of assembly accuracy may be expected for the device that includes the components and the circuit board due to the recent miniaturization and increasing thinness of the products. Thus, a manufactured circuit board is expected to have a high degree of flatness in order to meet the high degree of assembly accuracy of the device. However, warp in a manufactured circuit board may increase due to increased densities of components and increases in the size of the circuit board. Phenomena such as an increase in component connection failures may occur when a circuit board is warped. When a phenomenon such as an increase in component connection failures occurs, the design stage of the circuit board is reexamined to modify the design of the circuit board in order to address the warp of the circuit board. Therefore, warp in a circuit board is preferably taken into consideration when designing the circuit board with a graphic processing system.

A plurality of conventional techniques, such as those discussed in Japanese Laid-open Patent Publication No. 2005-190206, International Publication Pamphlet No. WO 2008-001922, and International Publication Pamphlet No. WO 01-050356 address the issue of warp in a circuit board. For example, a technique is known that involves using CAD data from a graphic processing system to derive a degree of warp of an outer surface layer of a circuit board and correct wiring and the like on the circuit board to remain within a prescribed value that does not allow phenomena such as an increase in component connection failures to occur when mounting components. Another technique involves using a simulation to derive an amount of warp generated due to heating of the outer surface layer of a circuit board. Still another technique involves deriving a temperature distribution inside a reflow furnace and modifying the positions of components to keep the outer surface layer of a circuit board within a prescribed range.

SUMMARY

According to an aspect of the invention, a board design aid device includes a calculating unit that groups a plurality of layers in a multi-layer board into a plurality of pairs of layers based on design information of the multi-layer board, the plurality of layers being stacked and derives a difference of total amounts in respect to a board design element, each of the total amounts being related to each layer of a pair of layers of the plurality of pairs of layers, the board design element being related to a warp of the multi-layer board; and a correcting unit that, based on the difference of the total amounts, corrects an amount of the board design element for at least one of layers among at least one of the plurality of the pairs of layers so that the difference of the total amounts of the board design element is maintained within a certain range.

According to an aspect of the invention, an apparatus includes

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 20 is an image of an example of a relationship between via counts in circuit boards.

DESCRIPTION OF EMBODIMENT

A desire for down-sizing and thinning a product and increasing the density of components urges to increase use of multi-layer boards which are formed by stacking a plurality of layers each having a complex shape and a complex circuit. Since warp in a circuit board may be easily confirmed from the outer surface layer, the size and position of the mounted components may be corrected and the arrangement of wiring may be determined. However, warp of internal layers inside a multi-layer board may be difficult to confirm. Therefore, it is difficult to achieve better flatness of a manufactured circuit board by only improving the flatness of the multi-layer board in the basis of checking the outer surface layer thereof.

Accordingly, it is desired to reduce warp in multi-layer board formed by stacking a plurality of layers and to achieve to prevent more effectively the multi-layer board from wrapping.

The following describes in detail examples of an embodiment of the disclosed technology with reference to the drawings.

Figure 1:
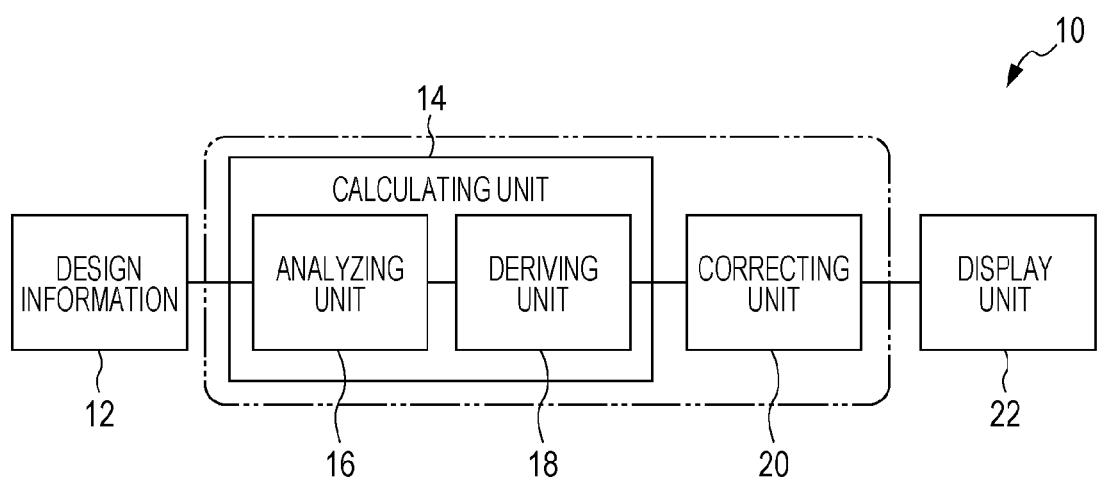
FIG. 1 is a block diagram of an example of a schematic diagram of a board design aid device.

FIG. 1 is an example of a board design aid device 10 according to the present embodiment. Design information 12 of a circuit board is inputted from a graphic processing system such as a CAD system into the board design aid device 10. The board design aid device 10 includes a calculating unit 14, a correcting unit 20, and a display unit 22. The calculating unit 14 includes an analyzing unit 16 and a deriving unit 18.

The board design aid device 10 is an example of the board design aid device of the technique disclosed herein. The calculating unit 14 is an example of a calculating unit of the technique disclosed herein, the correcting unit 20 is an example of a correcting unit of the technique disclosed herein, and the display unit 22 is an example of a display unit of the technique disclosed herein. The analyzing unit 16 is an example of an analyzing unit of the technique disclosed herein, and the deriving unit 18 is an example of a deriving unit of the technique disclosed herein.

The design information 12 of a multi-layer board including a plurality of circuit boards stacked, is inputted into the board design aid device 10. Based on the inputted multi-layer board design information 12, the calculating unit 14 groups the multi-layer board into a plurality of pairs of layers and derives a difference of total amounts of prescribed board design elements relating to warp of a multi-layer board, between each of the plurality of divided pairs of layers. Based on differences of total amounts of prescribed board design elements and based on the derived differences of the total amounts of the prescribed board design elements, the correcting unit 20 corrects the amount of the prescribed board design elements for at least one of the layers among at least one of the pairs of layers among the plurality of pairs of layers. A correction process is executed when correcting the amount of the prescribed board design elements so that a difference in the total amounts of the prescribed board design elements is kept within a prescribed range. Consequently, the total amounts of the prescribed board design elements among the plurality of pairs of layers included in the multi-layer board may be equalized and warp of the multi-layer board may be limited.

Figure 2:
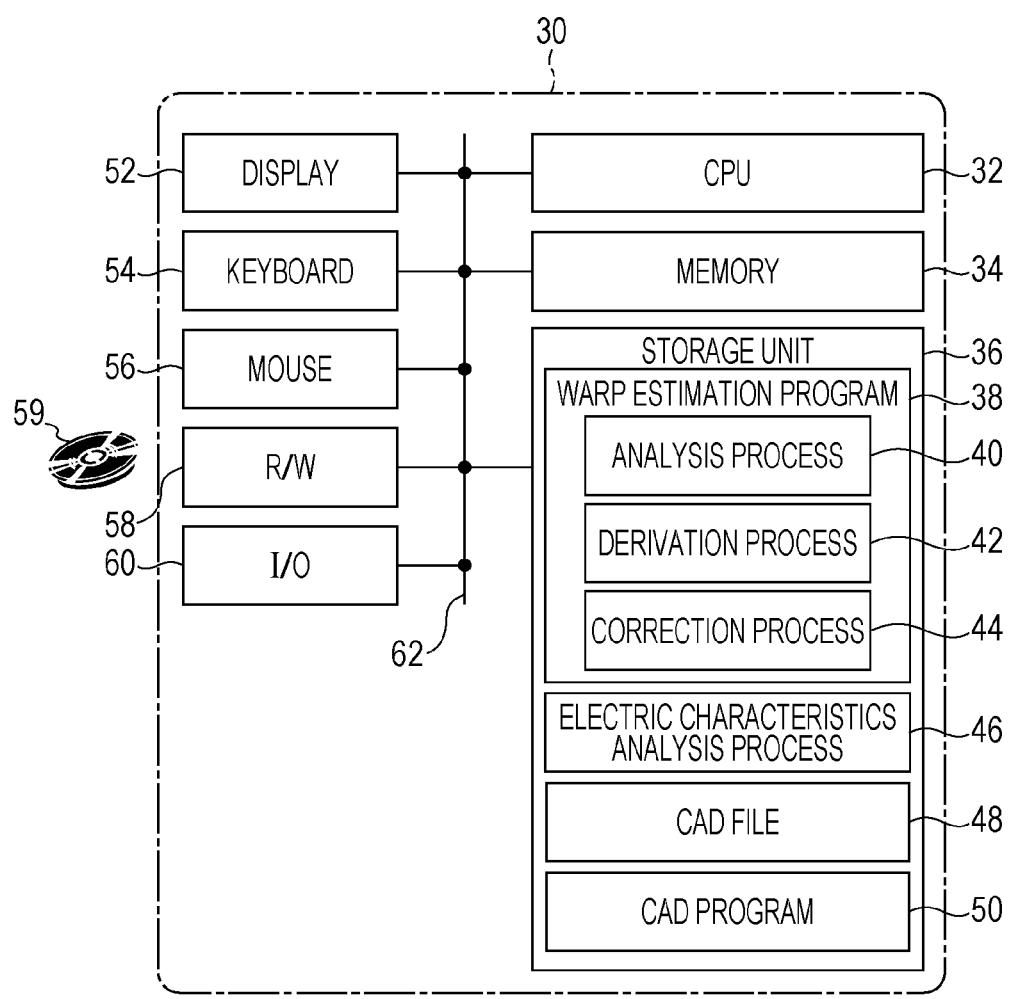
FIG. 2 is a block diagram of an example of the board design aid device realized by a computer.

FIG. 2 is an example of the board design aid device 10 realized by a computer 30. The computer 30 includes a CPU 32, a memory 34, and a non-volatile storage unit 36. The CPU 32, the memory 34, and the non-volatile storage unit 36 are interconnected by a bus 62. The computer 30 includes a display 52, a keyboard 54, and a mouse 56. The display 52, the keyboard 54, and the mouse 56 are interconnected by the bus 62. An interface (I/O) 60 for connecting the computer 30 to a computer network and the like, and a device (R/W) 58 for reading from and writing onto a recording medium 59 when the recording medium 59 is inserted therein, are connected to the bus 62. The storage unit 36 may be realized by a hard disk drive (HDD) or a flash memory unit.

A warp estimation program 38 is stored in the storage unit 36 as an example of a board design aid program for allowing the computer 30 to function as the board design aid device 10. The warp estimation program 38 includes an analysis process 40, a derivation process 42, and a correction process 44. The CPU 32 reads the warp estimation program 38 from the storage unit 36 and expands the warp estimation program 38 in the memory 34, and executes the processes included in the warp estimation program 38 in succession to enable the computer 30 to operate as the board design aid device 10 illustrated in FIG. 1. The CPU 32 executes the analysis process 40 to enable the computer 30 to operate as the analyzing unit 16 illustrated in FIG. 1, and executes the derivation process 42 to enable the computer 30 to operate as the deriving unit 18 illustrated in FIG. 1. The CPU 32 executes the analysis process 40 and the derivation process 42 to enable the computer 30 to operate as the calculating unit 14 illustrated in FIG. 1. The CPU 32 executes the correction process 44 to enable the computer 30 to operate as the correcting unit 20 illustrated in FIG. 1.

An electric characteristics analysis process 46 is stored in the storage unit 36 for analyzing the electric characteristics of a circuit board such as a printed board. A CAD program 50 is stored in the storage unit 36 for enabling the computer 30 to function as a graphic processing system such as a CAD system used when designing a circuit board such as a printed board. The storage unit 36 is able to store a CAD file 48 as design information created by the computer 30 being functioned as the graphic processing system.

While the example of the board design aid device 10 is described as being connectable to a computer network in the present embodiment, the board design aid device 10 is not limited to being connectable to a computer network. Specifically, the example of the board design aid device 10 disclosed herein may be realized only by the computer 30. In this case, it is available to use data such as CAD files which are stored in a recording medium and read from or written to the recording medium by the device (R/W) 58.

The following describes operations of the present embodiment. A circuit board 64 including seven layers of circuit boards stacked therein will be used in the explanation of the present embodiment as an example of the multi-layer board.

Figure 3:
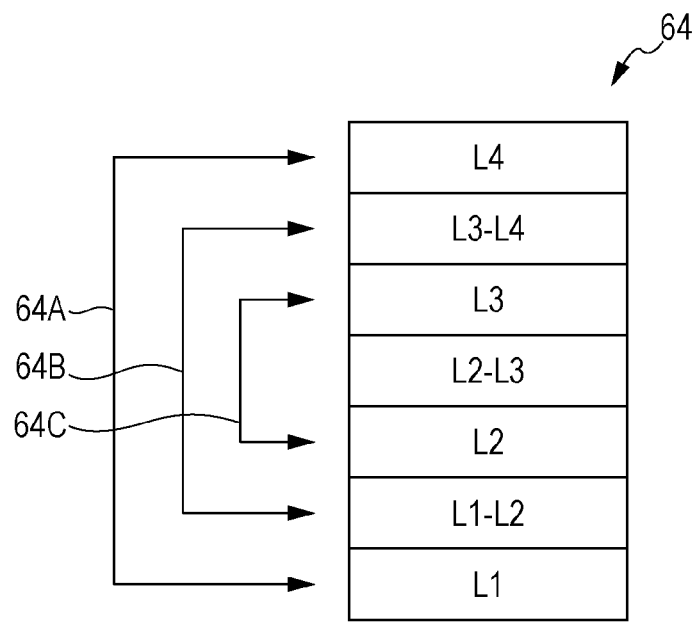
FIG. 3 is an image of an example of a circuit board.

An example of the circuit board 64 is illustrated in FIG. 3. The circuit board 64 is a multi-layer board including stacked therein seven layers comprising a first layer (L1), a second layer (L1-L2), a third layer (L2), a fourth layer (L2-L3), a fifth layer (L3), a sixth layer (L3-L4), and a seventh layer (L4). In the example illustrated in FIG. 3, the first layer (L1), the third layer (L2), the fifth layer (L3), and the seventh layer (L4) are conductor layers, and the second layer (L1-L2), the fourth layer (L2-L3), and the sixth layer (L3-L4) are insulator layers.

Figure 4:
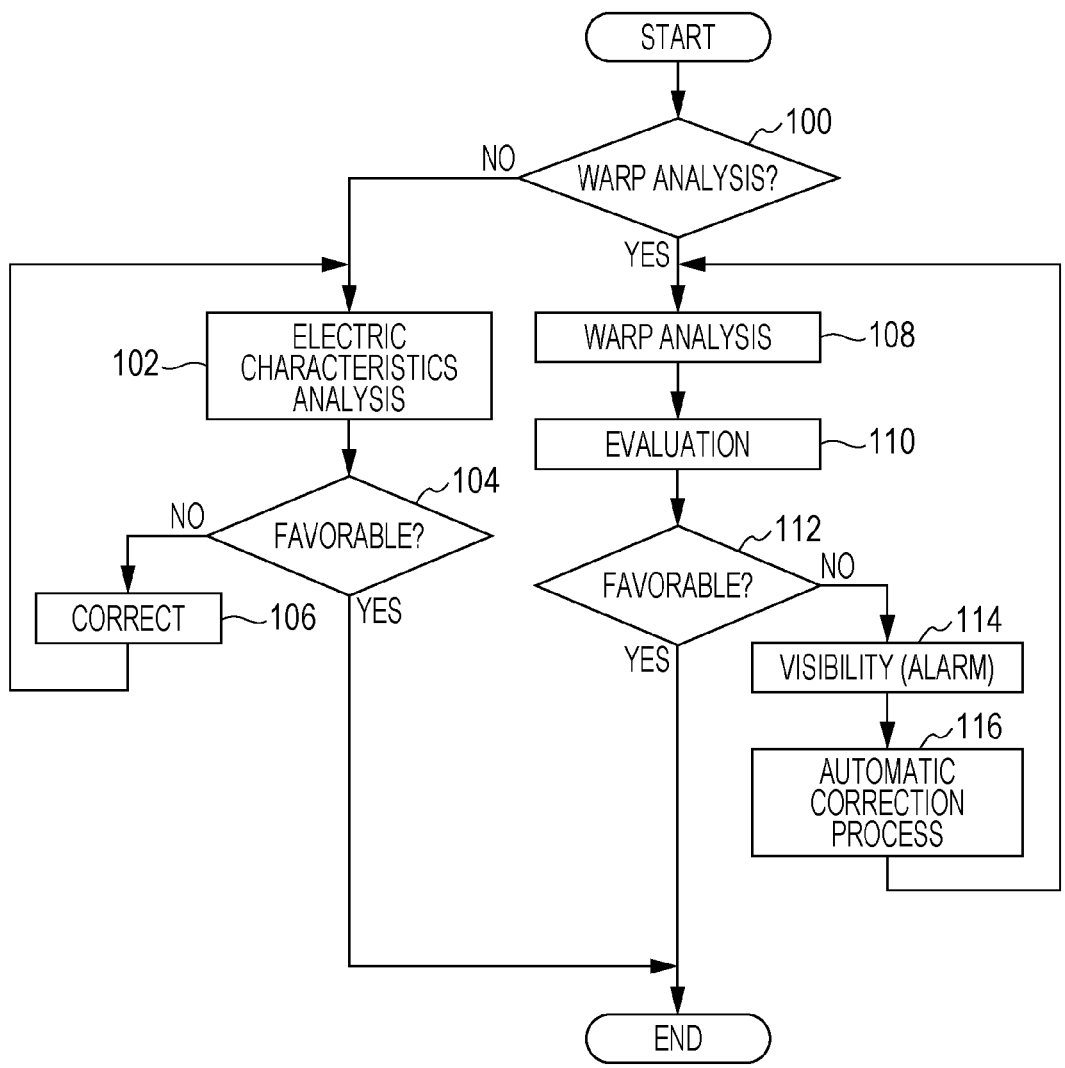
FIG. 4 is a flow chart describing an example of a flow of an analysis process that includes a warp estimation process.

FIG. 4 is an example of a flow of an analysis process including a warp estimation process. The analysis process including the warp estimation process illustrated in FIG. 4 includes an example of a process executed by the warp estimation program 38 as an example of a board design aid program. The circuit board 64 is preferably configured to prevent it from warping in addition to maintain, as the primary and important function, normally electrical characteristics of the circuit board 64. An electric characteristics analysis and a warp analysis may be selectively executed in the present embodiment. A circuit board 64 demonstrating favorable results determined by of both the electric characteristics analysis and the warp analysis is used as a preferable circuit board 64 to be mounted in a product.

The CPU 32 starts the analysis process to determine whether executing a warp analysis process in step 100. When a negative determination is made in step 100, an analysis process of the electrical characteristics of the circuit board 64 is executed. When a positive determination is made in step 100, an analysis process for analysing the warp of the circuit board 64 is executed.

The electric characteristics analysis process is executed in the analysis process of the electric characteristics in step 102. When the electric characteristics analysis process is completed, a determination is made in step 104 as to whether the analysis results of the electric characteristics of the circuit board 64 are acceptable. The determination process in step 104 may execute so that each of the electric characteristics of the circuit board 64 analyzed in step 102 is no less than a prescribed characteristic value or within a prescribed characteristic range, for example, where an electric characteristic is determined in advance as acceptable or good when the electric characteristic is equal to or above the prescribed characteristic value or within the prescribed characteristic range. When a positive determination is made in step 104, the routine is finished since the electric characteristics of the circuit board 64 are acceptable. In this case, information indicating that the electric characteristics of the circuit board 64 are acceptable may be displayed on the display 52. When a negative determination is made in step 104, a known process for correcting the electric characteristics of the circuit board 64 is executed in step 106, and then the routine returns to step 102.

The analysis process of the electric characteristics may be achieved by the CPU 32 executing the electric characteristics analysis process 46. That is, the CPU 32 reads the electric characteristics analysis process 46 from the storage unit 36 to expand the analysis process 46 in the memory 34 and to execute the electric characteristics analysis process 46. As a result, the computer is led to execute the analysis process of the electric characteristics.

Figure 5:
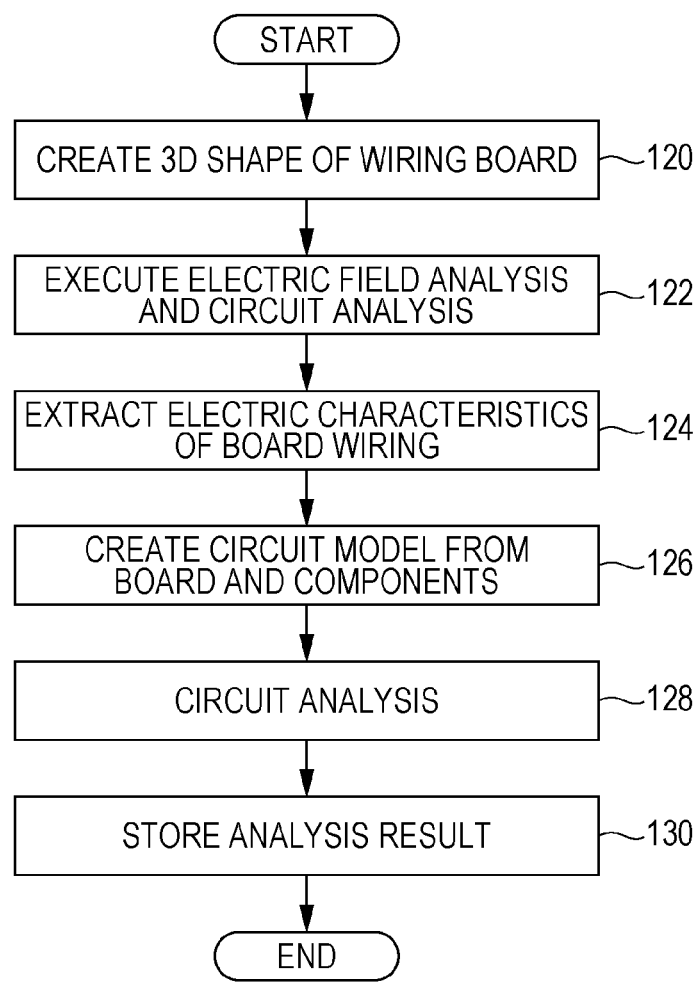
FIG. 5 is a flow chart describing an example of a flow of an electrical characteristics analysis process.

FIG. 5 illustrates an example of the electric characteristics analysis process executed in step 102 in FIG. 4. First, the CAD file 48 including the design information of the circuit board 64 is obtained to create information indicating three-dimensional shapes of wiring on the circuit board 64 (step 120). Next, a three-dimensional magnetic field analysis and a circuit analysis are executed together (step 122). When executing the three-dimensional magnetic field analysis and the circuit analysis, information indicating the electric characteristics of components mounted on the circuit board 64 is obtained, and a three-dimensional analysis for the circuit board 64 is executed and a circuit analysis for the mounted components is executed. Next, the electric characteristics of the board wiring are extracted (step 124). A circuit model is then created based on the circuit board 64 and the mounted components (step 126), and the circuit analysis is executed using the created circuit model (step 128). The information indicating the results determined by the three-dimensional magnetic field analysis and the circuit analysis, and information indicating the results of the circuit analysis determined by using the circuit model, are stored as analysis results (step 130), and then the routine is finished. Examples of analysis results are for example crosstalk between drivers and receivers and a reception waveform received by a receiver.

When a positive determination is made in step 100 in FIG. 4, the warp estimation process of the circuit board 64 is executed and the routine advances to step 108. In step 108, the warp analysis process of the circuit board 64 is executed. The warp analysis process of the circuit board 64 involves obtaining the CAD file 48 of the circuit board 64 and executing an analysis process to derive a warp amount of the circuit board 64 by using, for example, the analysis function of the CAD program 50. The information indicating the results of the analysis process is stored in the memory 34. Next, the analysis results from the warp analysis process of the circuit board 64 are evaluated in step 110 as described in detail below. Whether the evaluation results determined in step 110 are acceptable or not is determined in step 112. When a positive determination is made in step 112, the routine is finished, and when a negative determination is made, the routine advances to step 114. In step 114, the evaluation results determined in step 110 are displayed in step 114, and after an automatic correction process is executed in step 116 as described in detail below, the routine returns to step 108. In step 114, the evaluation results determined in step 110 are displayed on the display 52 and notable locations in the evaluation results may be clarified and displayed on the display 52.

The warp estimation process of the circuit board 64 may be realized by the CPU 32 executing the warp estimation program 38. Specifically, the warp estimation process of the circuit board 64 is executed by the computer 30 due to the CPU 32 reading the warp estimation program 38 from the storage unit 36 and expanding the same in the memory 34 and then executing the warp estimation program 38.

The analysis process executed in step 108 of the warp of the circuit board 64 may be realized by the CPU 32 executing the analysis process 40 included in the warp estimation program 38. That is, the CPU 32 reads the analysis process 40 from the storage unit 36 and expands the same in the memory 34 to execute the analysis process 40 thus enabling the computer 30 to execute the analysis process of the warp of the circuit board 64. The automatic correction process of the circuit board 64 may be realized by the CPU 32 executing the derivation process 42 and the correction process 44. That is, the CPU 32 reads the derivation process 42 and the correction process 44 from the storage unit 36 and expands the same in the memory 34 to execute the derivation process 42 and the correction process 44 thus enabling the computer 30 to execute the automatic correction process of the circuit board 64.

Figure 6:
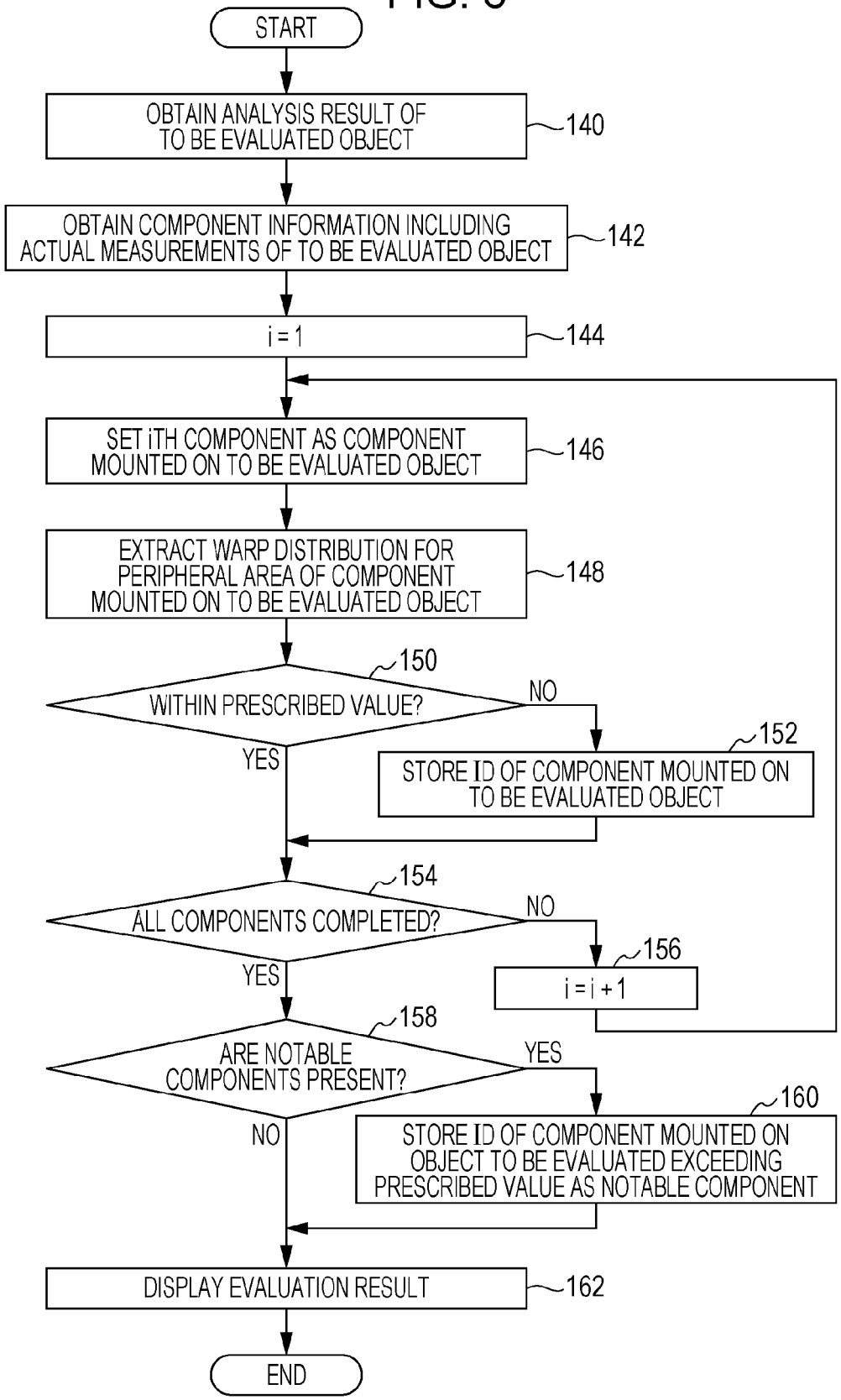
FIG. 6 is a flow chart describing an example of a flow of an evaluation process.

Next, a detailed example of the evaluation process executed by the computer 30 will be described. FIG. 6 illustrates an example of the evaluation process executed in step 110 in FIG. 4.

First, in step 140, the analysis results of the circuit board 64 to be evaluated are obtained. Specifically, the analysis results stored in the memory 34 in step 108 in FIG. 4 are read. In step 142, component information that includes actual measurement values of the circuit board 64 to be evaluated is obtained. In step 142, the actual measurement values related to the warp of the circuit board 64, and various types of information such as the shapes and the electric characteristics of the components mounted on the circuit board 64 are read. The actual measurement values related to the warp of the circuit board 64 may be measured when manufacturing the circuit board 64 and may be stored in association with the CAD file 48 of the circuit board 64.

Information indicating the warp of the circuit board 64 in consideration of the actual measurement values related to the warp of the circuit board 64 with respect to the analysis results of the circuit board 64 to be evaluated may be created in step 142. For example, the actual measurement values may be compared with values in the information indicating the warp of the circuit board 64 in the analysis results, and if actual measurement values that exceed the analysis results are present, a difference between the values in the information in the analysis results and the actual measurement values may be added to the values in the information in the analysis results.

Next, in step 144, a variable i is set to "1" (i=1), and in step 146, the ith component among all the components installed on the circuit board 64 is set as a mounted component to be evaluated. Analysis results of warp in a peripheral area that includes the position of the mounted component to be evaluated on the circuit board 64 are extracted as a distribution of warp in step 148 among the analysis results of the warp obtained in step 140. Next, a determination is made in step 150 as to whether warp amounts indicated in the distribution of warp extracted in step 148 are within a predetermined prescribed value. The predetermined prescribed value used in the determination process in step 150 is a permissible value that is predetermined as a warp amount of the circuit board 64. When a positive determination is made in step 150, the routine advances to step 154. When a negative determination is made in step 150, an identification ID for identifying the mounted component to be evaluated that exceeds the prescribed value is attributed to the current ith component in step 152, and the identification ID is stored in the memory 34.

Next, a determination is made in step 154 as to whether the processing from steps 146 to 152 has been completed for all of the components mounted on the circuit board 64. When a negative determination is made, the variable i is incremented in step 156 and the routine returns to step 146. Conversely, when a positive determination is made in step 154, a determination is made in step 158 as to whether a notable component is present or not. The determination process in step 158 may be executed by determining whether an identification ID attributed in step 152 is stored in the memory 34.

When a negative determination is made in step 158, analysis results that include information indicating that no notable components are present is displayed on the display 52 as information indicating evaluation results. Conversely, when a positive determination is made in step 158, the component to which the identification ID is attributed as a mounted component to be evaluated that exceeds the prescribed value, is stored as a notable component in step 160. The routine then advances to step 162 and the stored notable component is displayed on the display 52.

Figure 7:
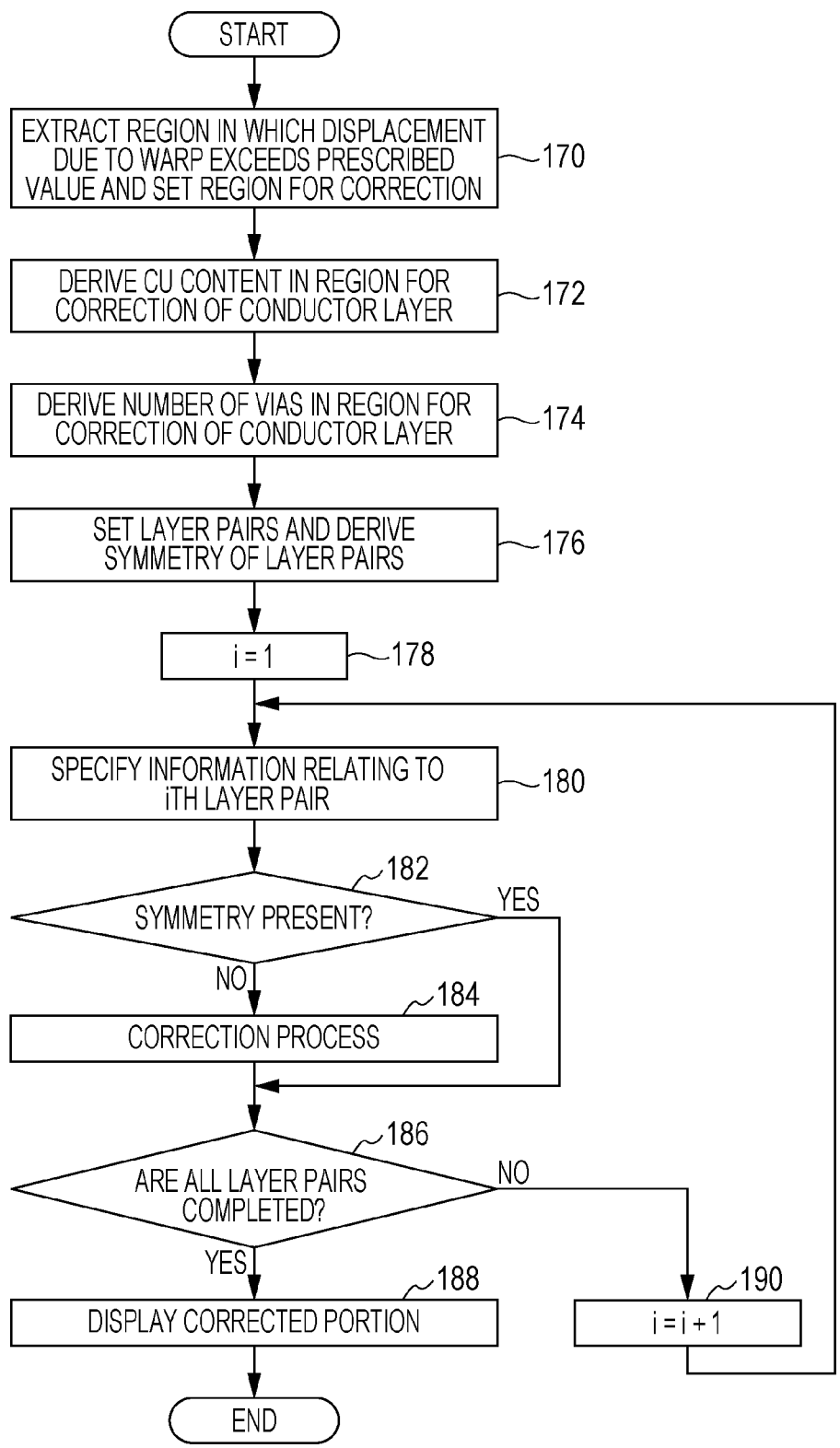
FIG. 7 is a flow chart describing an example of a flow of an automatic correction process.

Next, a detailed example of the automatic correction process executed by the computer 30 will be described. FIG. 7 is an example of a flow of the automatic correction process executed in step 116 in FIG. 4.

Figure 8:
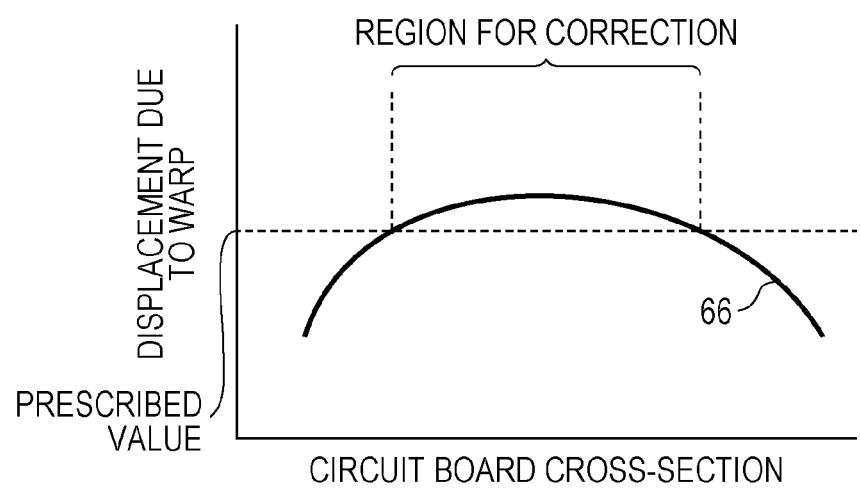
FIG. 8 describes warp of a circuit board.

First, a region in which displacement due to warp exceeds the prescribed value is extracted in step 170, and the extracted region is set as a region for correction. The prescribed value used in step 170 is predetermined as a permissible value for the amount of warp in a portion of the circuit board 64. The extraction in step 170 is conducted on a region on the circuit board 64 in which the displacement amount of the circuit board 64 exceeds the prescribed value in accordance with the amount of warp indicated in the analysis results (processing result from step 108 in FIG. 4). As illustrated in the example in FIG. 8, the extraction is conducted on a region on the circuit board 64 in which a characteristic curve 66 that indicates displacement of the circuit board 64 represents a value that exceeds the prescribed value.

Next, the content of copper (Cu content) inside the region for correction is derived when targeting a conductor layer among the plurality of layers in the circuit board 64. The copper content may be derived from a surface area ratio between the surface area of the region for correction and the surface area occupied by copper. Next, a via count inside the region for correction is derived when targeting an insulator layer among the plurality of layers in the circuit board 64 in step 174. Layer pairs among the layers in the circuit board 64 are set in step 176. A layer pair is set as a pair of layers in symmetrical positions in relation to the center of the circuit board 64. In the example illustrated in FIG. 3, layer pairs are set in order from the outside layers toward the inside layers in relation to the center of a center portion (e.g., the center layer) of the circuit board 64. Specifically, the outermost layers represented by the first layer (L1) and the seventh layer (L4) are set as a layer pair 64A, the second layer (L1-L2) and the sixth layer (L3-L4) are set as a layer pair 64B, and the third layer (L2) and the fifth layer (L3) are set as a layer pair 64C. Information indicating the symmetry of the set layer pairs is also derived in step 176. When targeting a conductor layer, a difference of the content of copper (Cu content) between the layers in the layer pair is associated with the information indicating symmetry. When targeting an insulator layer, a difference of the via counts between the layers in the layer pair is associated with the information indicating symmetry.

Next, in step 178, a variable i is set to "1" (i=1), and in step 180, the ith layer pair in the circuit board 64 is set. Therefore, information indicating symmetry relating to the ith layer pair may be specified in step 180. A determination is made in step 182 as to whether or not symmetry is present in the ith layer pair based on the information indicating symmetry specified in step 180. When a positive determination is made in step 182, the routine advances to step 186. When a negative determination is made, a correction process, which is described in detail below, is executed in step 184 so that the current ith layer pair has symmetry, and then the routine advances to step 186.

A determination is made in step 186 as to whether or not all the processes in steps 180 to 184 have been executed on all the layer pairs set in the circuit board 64. When a negative determination is made, the variable i is incremented in step 190 and the routine returns to step 180. Conversely, when a positive determination is made in step 186, the portion corrected with the execution of step 184 so that the layer pair has symmetry is displayed on the display 52 and the routine is finished.

The process related to setting the layer pairs and deriving the information indicating symmetry in the automatic correction process of the circuit board 64 may be realized by executing the derivation process 42. The correction process executed so that the layers in the layer pair have symmetry may be realized due to the CPU 32 executing the correction process 44.

Figure 9:
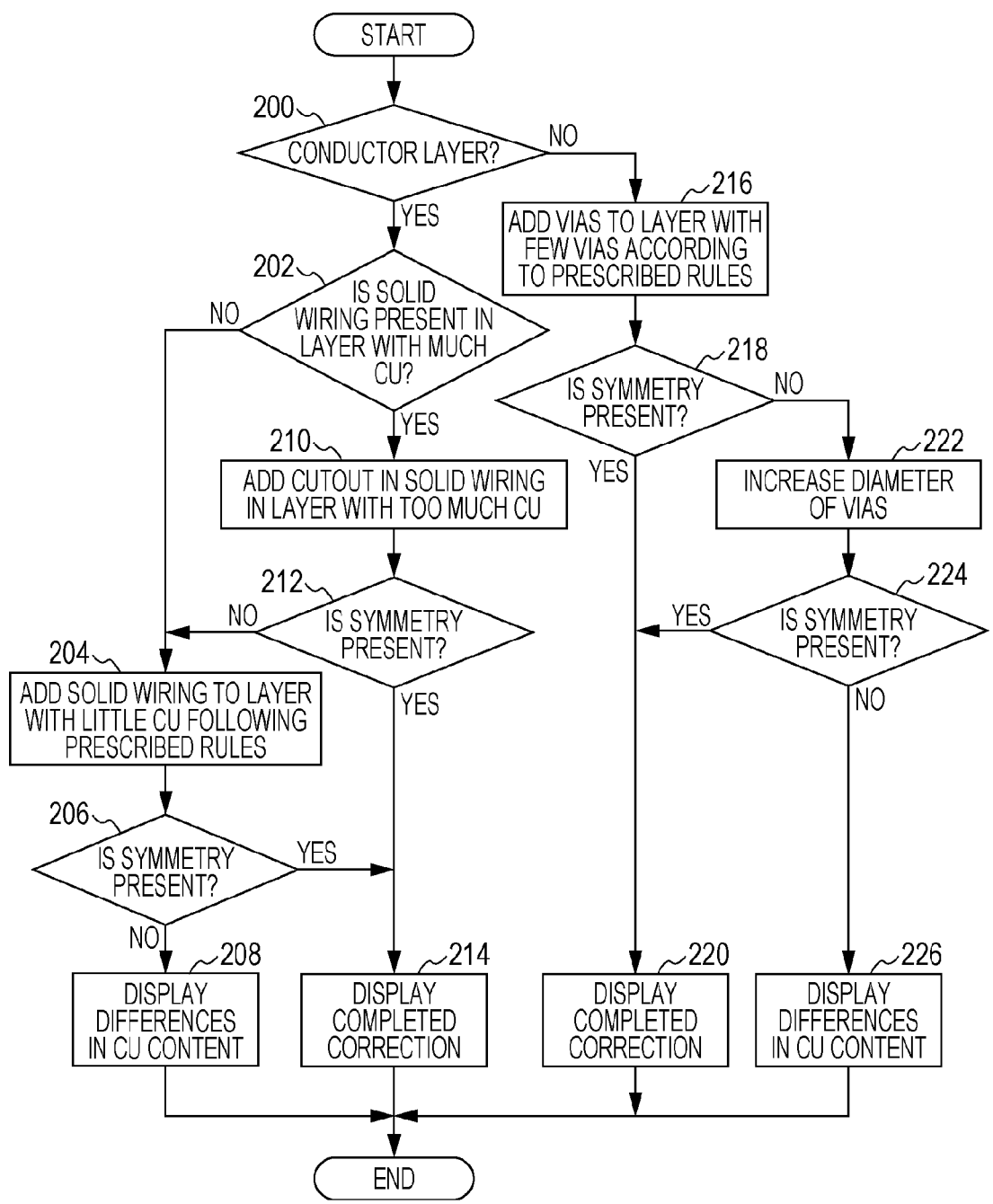
FIG. 9 is a flow chart of a flow of a correction process.

Next, a detailed example of the correction process executed by the computer 30 will be described. FIG. 9 is an example of a flow of the correction process executed in step 184 in FIG. 7.

A determination is made in step 200 as to whether a layer pair to be subjected to the correction process, which is specified in step 180 in FIG. 7, is a conductor layer. When a positive determination is made in step 200, the routine advances to step 202 and a determination is made as to whether a solid wiring is present in layers with much copper in the layer pair to be subjected to the correction process. Specifically, the copper content of the layers in the layer pair to be subjected to the correction process is obtained in step 202, and a determination is made as to whether a solid wiring is present in a layer with high copper content. When a negative determination is made in step 202, the routine advances to step 204 and a process, which is described in detail below, to add a solid wiring to another layer, that is, to a layer with lower copper content, is executed according to prescribed rules. A determination is made in step 206 as to whether the layer pair which received the solid wiring has symmetry or not. When a negative determination is made in step 206, a process is executed to display, on the display 52, a difference of the copper content that indicates that symmetry is not present. Conversely, when a positive determination is made in step 206, the routine advances to step 214.

When a positive determination is made in step 202, a process which is described in detail below is executed in step 210 to add, to the solid wiring that is present in the layer with high copper content in the layer pair subjected to the correction process, a cutout in the solid wiring in order to reduce the region of the solid wiring. A determination is made in step 212 as to whether the layer pair which received the solid wiring cutout has symmetry or not. When a negative determination is made in step 212, the routine advances to step 204. When a positive determination is made, a process to display on the display 52 information indicating that the correction to give symmetry to the layer pair is completed is executed.

When the layer pair subject to the correction process specified in step 180 in FIG. 7 is an insulator layer, a negative determination is made in step 200 and the routine advances to step 216. A process described in detail below is executed to add vias to a layer with few vias according to prescribed rules. A determination is made in step 218 as to whether the layer pair which received the vias has symmetry or not. When a positive determination is made in step 218, the routine advances to step 220 and a process is executed to display information on the display 52 indicating that the correction to give symmetry to the layer pair of insulator layers is completed. When a negative determination is made in step 218, a process to increase the diameters of the vias added in step 216 is executed, and the routine advances to step 224. A determination is made in step 224 as to whether the layer pair in which the diameter of the added vias is increased has symmetry or not. When a negative determination is made in step 224, a process is executed to display, on the display 52, the difference in the copper content that indicates the symmetry is not present. When a positive determination is made in step 224, the routine advances to step 220 and a process is executed to display information on the display 52 indicating that the correction to give symmetry to the layer pair of insulator layers is completed.

Figure 10:
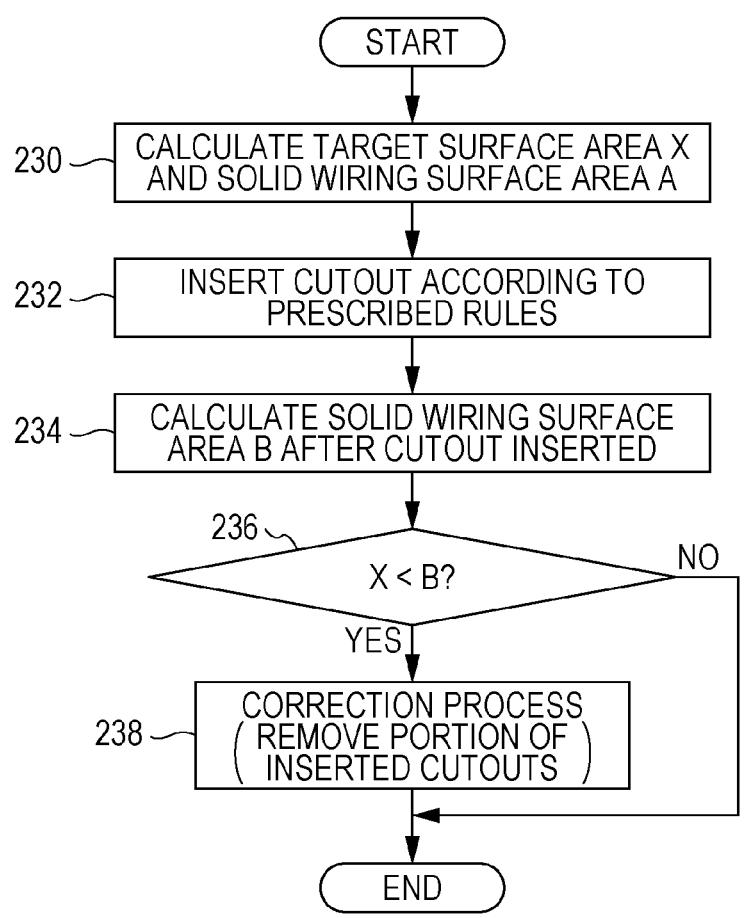
FIG. 10 is a flow chart describing an example of a flow of a solid wiring cutout addition process.

Next, an example will be described of the process executed in step 210 in FIG. 9 to add a cutout to the solid wiring in order to reduce the solid wiring region in a layer in which the copper content is high and solid wiring is present among a layer pair of conductor layers. FIG. 10 illustrates an example of a flow of the process for adding a solid wiring cutout executed in step 210 in FIG. 9.

A target surface area X and a solid wiring surface area A are calculated in step 230. The solid wiring surface area A is the surface area of solid wiring in a layer in which the copper content is high and solid wiring is present among a layer pair of conductor layers. The target surface area X is the surface area of solid wiring in the other layer among the layer pair of conductor layers. The target surface area X may prescribe the surface area corresponding to a high copper content in the other layer of the layer pair of conductor layers. Next, a process is executed in step 232, according to prescribed rules, to add a cutout to the solid wiring region in the layer having the high copper content and in which the solid wiring is present. The prescribed rules in step 232 include the size and shape and the periodicity of the arrangement of the solid wiring cutout that may be added to the solid wiring region.

Figure 11:
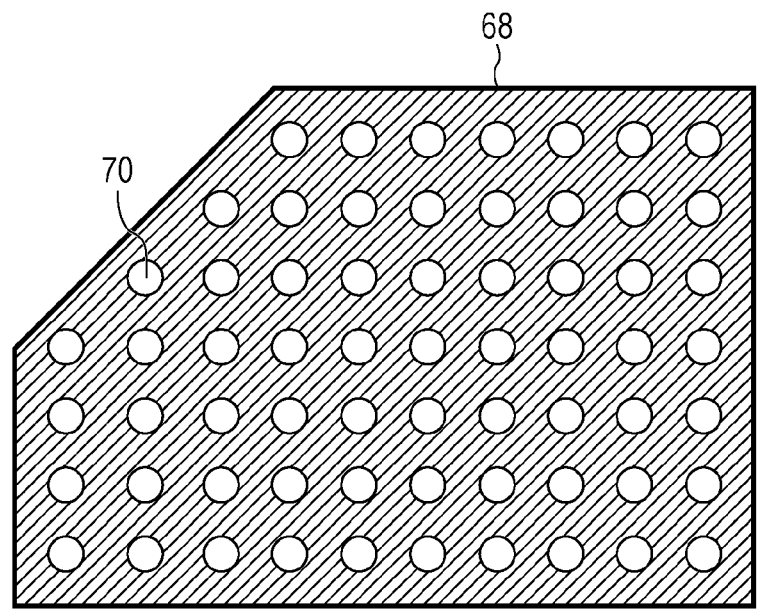
FIG. 11 is an image of an example when a solid wiring cutout addition is executed.

FIG. 11 illustrates an example when the process to add a solid wiring cutout is executed according to prescribed rules. A cutout region 70 having a prescribed shape such as a circular in FIG. 11 and a prescribed size is set within a fixed interval, or periodically, in a solid wiring region 68 in one of the layers in a layer pair of conductor layers. A solid wiring cutout is added by removing a plurality of set cutout regions 70 from the solid wiring region 68.

A surface area B of the solid wiring region 68 to which the cutout has been added is calculated in step 234, and a determination is made in step 236 as to whether X is less than B. When the target surface area X and the surface area B match, or when the target surface area X is greater than the surface area B, a negative determination is made in step 236 and the routine is finished. Conversely, when X is less than B, a positive determination is made in step 236. When a positive determination is made in step 236, a correction process is executed in step 238 to remove a portion of the solid wiring cutout added in step 232 since an excessive amount of the solid wiring cutout has been added.

Figure 12:
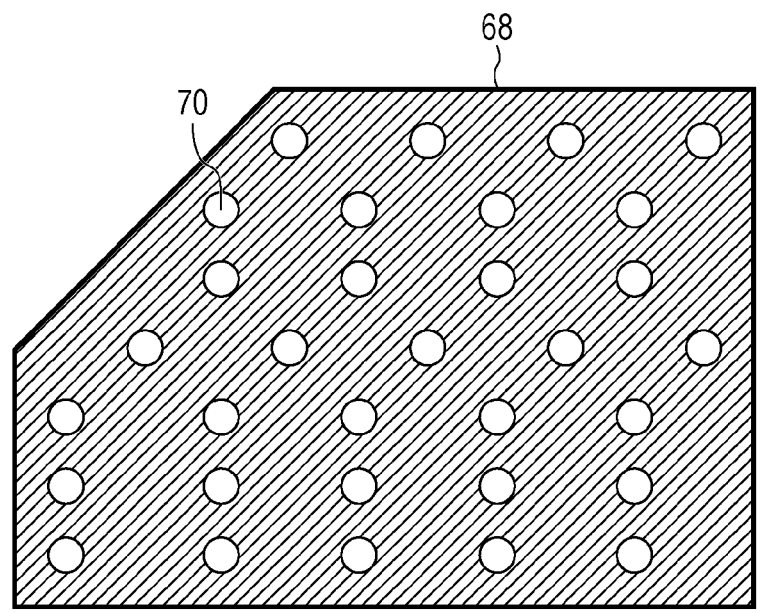
FIG. 12 is an image of an example when a portion of a solid wiring cutout is removed.

FIG. 12 illustrates an example when a portion of the solid wiring cutout is removed when an excessive amount of the solid wiring cutout has been added. As illustrated in FIG. 12, a portion of the cutout regions 70 are removed from the solid wiring region 68, illustrated in FIG. 11, in which solid wiring cutouts have been excessively set.

When removing the portion of the cutout region 70 in step 238, it is preferable that the cutouts are added or removed equally in the solid wiring region 68. Specifically, it is preferable that the distribution of copper in the solid wiring region 68 is balanced and that regions containing copper are not unevenly balanced in the solid wiring region 68. For example, the cutout regions 70 that have been excessively added are removed in equal intervals. A number obtained by the equation {B/(B−X)} may be set as cutout intervals as an example of an equal interval.

Figure 13:
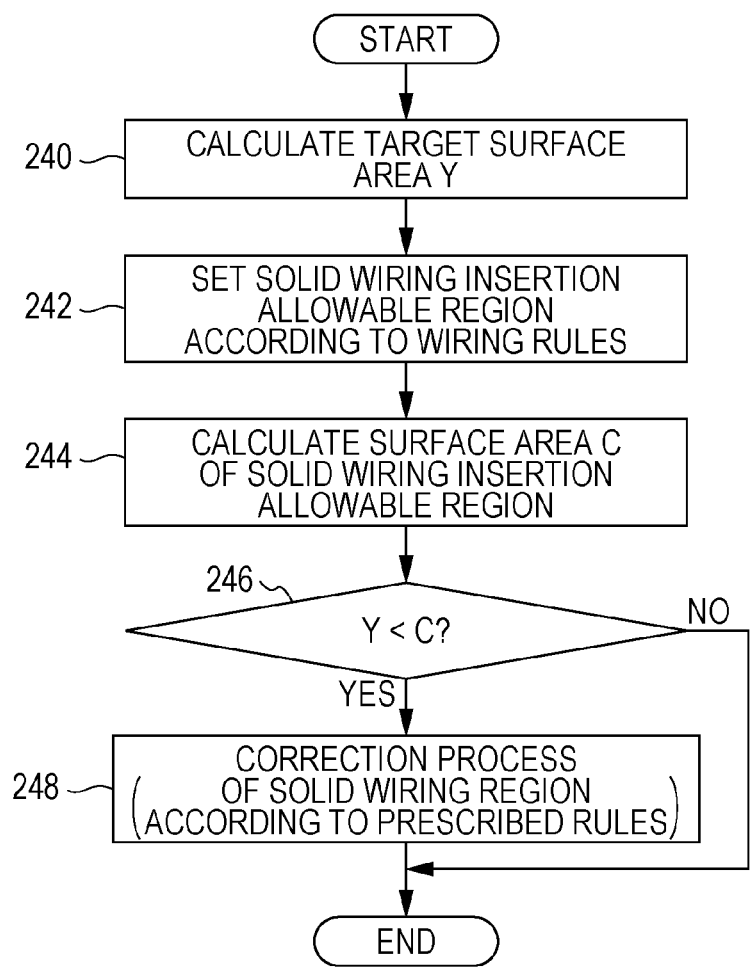
FIG. 13 is a flow chart describing an example of a flow of a solid wiring addition process.

Next, an example will be described of the process executed in step 204 in FIG. 9 to add solid wiring in order to enlarge the solid wiring region in a layer in which the copper content is low among a layer pair of conductor layers. FIG. 13 illustrates an example of a flow of a solid wiring addition process executed in step 204 in FIG. 9.

A target surface area Y is calculated in step 240. The target surface area Y is the surface area of solid wiring in another layer with respect to the layer with low copper content among the layer pair of conductor layers. The target surface area Y may prescribe the surface area corresponding to copper content in the other layer of the layer pair of conductor layers. A region in which solid wiring may be inserted is set in step 242 according to wiring rules in the layer with low copper content among the layer pair of conductor layers. The wiring rules in step 242 may include establishing a solid wiring prohibited region up to a prescribed distance away from a wiring region, allowing vias to be provided, or excluding a predetermined solid wiring prohibited region and the like.

Figure 14:
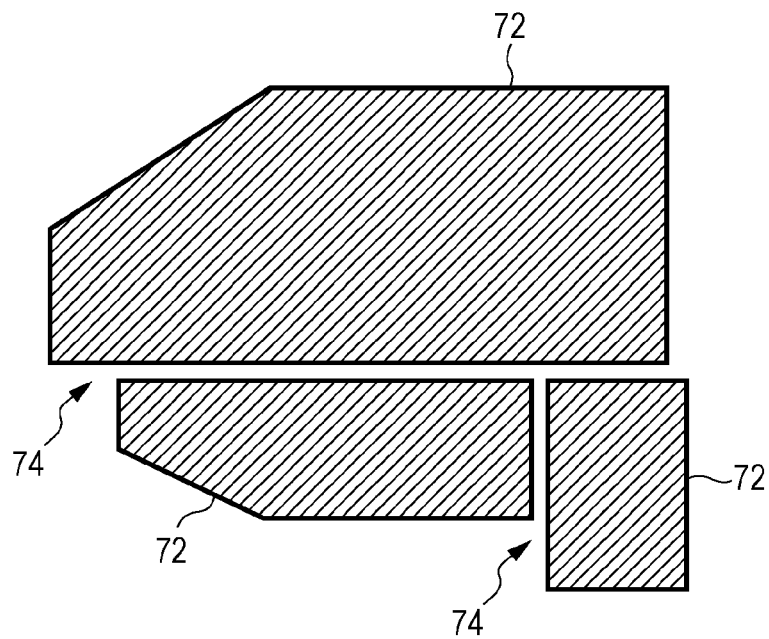
FIG. 14 is an image of an example when setting of a solid wiring insertion allowable region is executed.

FIG. 14 illustrates an example in which a setting process to set a solid wiring insertion allowable region is executed according to the wiring rules. The example in FIG. 14 illustrates a case in which a solid wiring prohibited region 74 is excluded and a plurality of solid wiring insertion allowable regions 72 are set.

A surface area C of the solid wiring insertion allowable region 72 is calculated in step 244, and a determination is made in step 246 as to whether Y is less than C. When the target surface area Y and the surface area C match, or when the target surface area Y is greater than the surface area C, a negative determination is made in step 246 and the routine is finished. Conversely, when Y is less than C, a positive determination is made in step 246. When a positive determination is made in step 246, a correction process is executed in step 248 to remove a portion of the solid wiring cutout added in step 232 since an excessive amount of the solid wiring cutout has been added, and then the routine is finished. The correction process in step 248 may be the execution of the process to add a solid wiring cutout due to the solid wiring region being reduced in FIG. 10.

Figure 15:
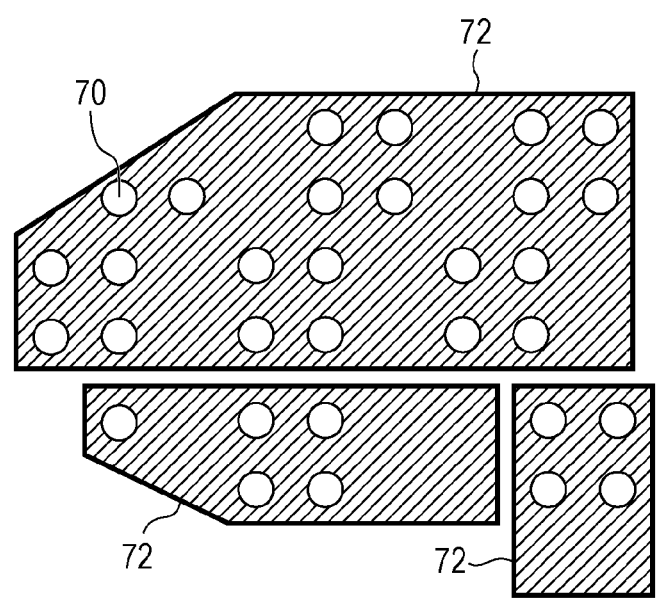
FIG. 15 is an image of an example when a solid wiring cutout is executed in a portion.

FIG. 15 illustrates an example of the execution of a solid wiring cutout process in a portion in which an excessive amount of solid wiring has been added. As illustrated in FIG. 15, a portion of the solid wiring region 72 is removed, by the addition of the cutout regions 70, from the solid wiring region 72 illustrated in FIG. 11 as a region added an excessive amount of solid wiring or pattern.

Figure 16:
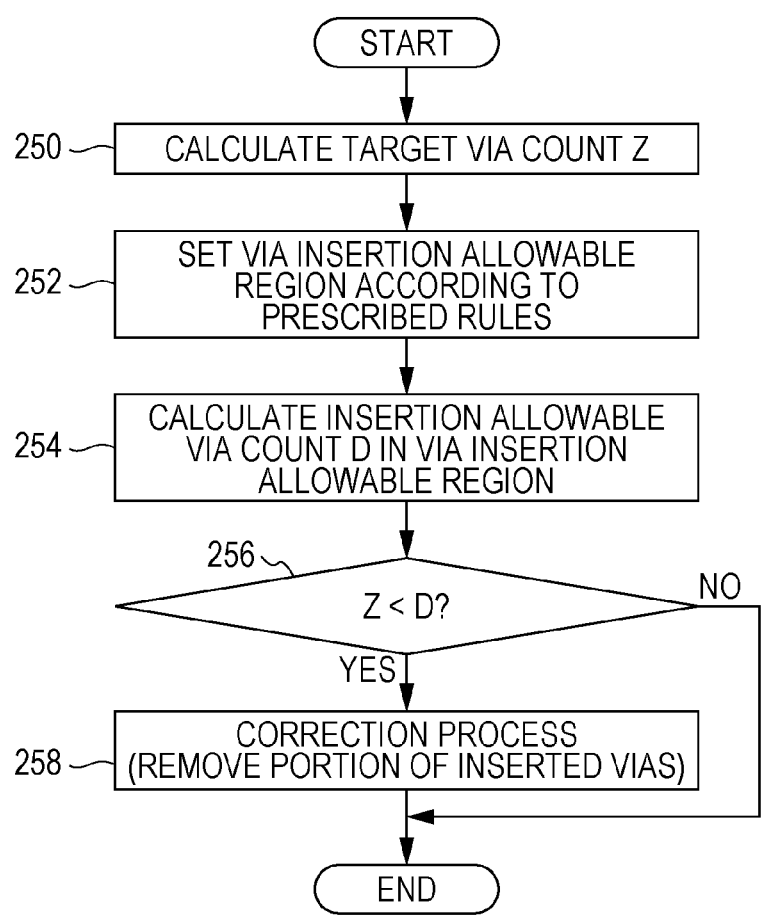
FIG. 16 is a flow chart describing an example of a flow of a via addition process.

The process executed in step 216 in FIG. 9 of adding vias to a region with few vias in the layer pair of the insulator layer will be described next. FIG. 16 illustrates an example of the via addition process executed in step 216 in FIG. 9.

A target via count Z is calculated in step 250. The target via count Z may set the number of vias in a layer other than a layer with few vias in the layer pair of insulator layers. The target via count Z may prescribe a via count that is previously confirmed by testing. A via insertion allowable region is set according to prescribed rules in step 252. A via count D that may be inserted into the via insertion allowable region set in step 252 is calculated in step 254. The vias that may be inserted into the via insertion allowable region in step 254 are determined based on the size and shape of the vias and on the periodicity of the arrangement of vias.

The via insertion allowable region from step 252 is a region in an insulator layer in which vias may be provided, and a region prescribed by a fixed peripheral region that includes provided vias. The prescribed rules in step 252 include the possibility of using design rules for the circuit board 64. An example of a design rule includes a rule such as establishing a fixed region away from wiring of an conductor layer (signal layer) in a layer stacked above or below the applicable insulator layer, where the fixed region is a via prohibited region to which a via is prohibited to be added. Another example of a design rule includes a rule such as establishing solid wiring set in an conductor layer (signal layer) in a layer stacked above or below the applicable insulator layer as a via prohibited region and not adding vias to that region. Still another example includes a rule of not adding vias to a predetermined via prohibited region.

Figure 17:
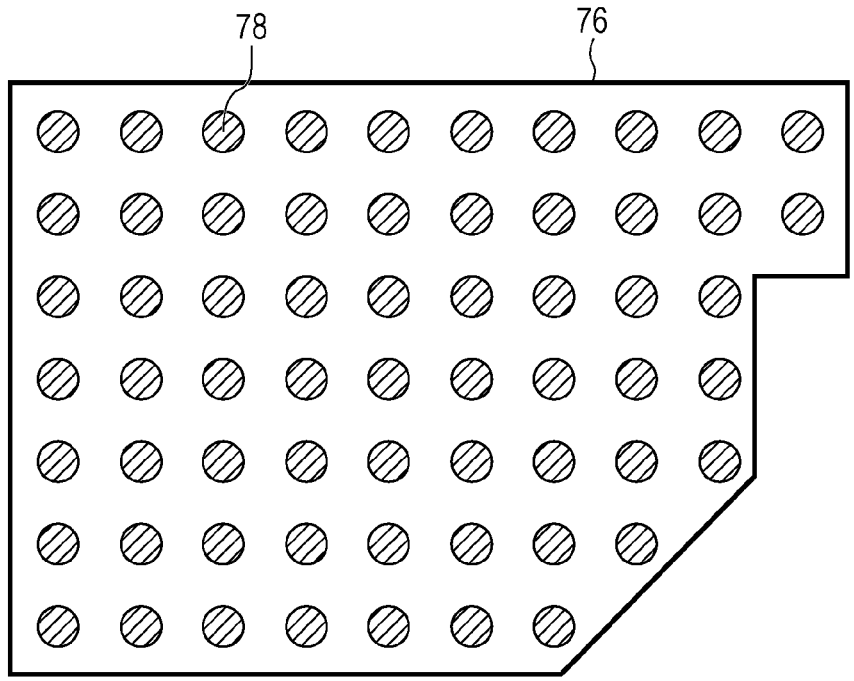
FIG. 17 is an image of an example when adding vias to a solid wiring insertion allowable region.

FIG. 17 illustrates an example of the execution of the addition of vias 78 to a via insertion allowable region 76 set according to prescribed rules. The vias 78 having a prescribed shape such as a circular in FIG. 17 and a prescribed size are set within a fixed interval or periodically in a via insertion allowable region 76 in one of the layers in a layer pair of insulator layers.

A determination is made in step 256 as to whether Z is less than D. When the target via count Z and the via count D that may be inserted match, or when the target via count Z is greater than the via count D that may be inserted, a negative determination is made in step 256 and the routine is finished. Conversely, when Z is less than D, a positive determination is made in step 256. When a positive determination is made in step 256, a correction process is executed in step 258 to reduce the via count added in step 254 since an excessive amount of vias has been added, and the routine is finished.

Figure 18:
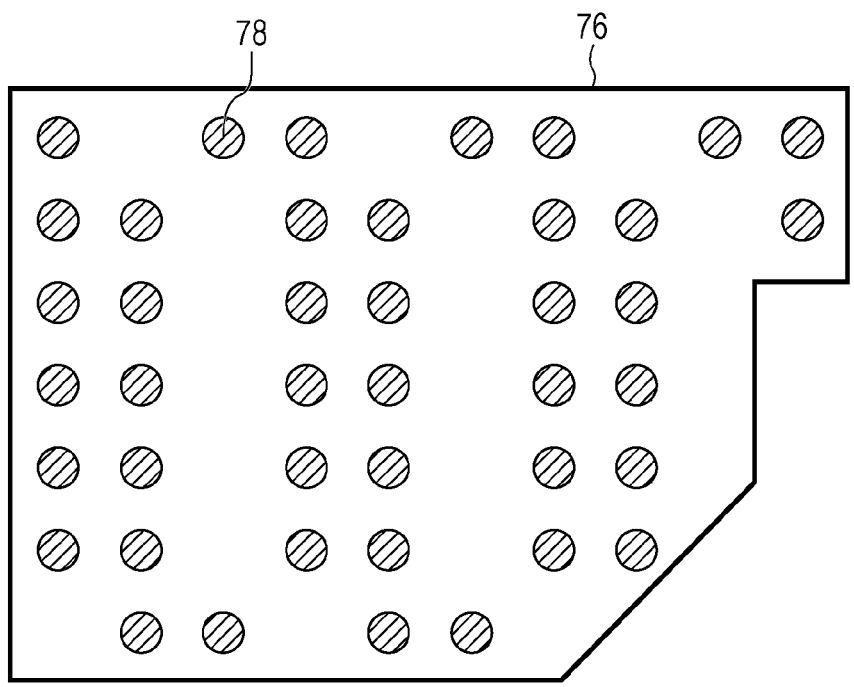
FIG. 18 is an image of an example when a portion of vias are removed.

FIG. 18 illustrates an example in which a portion of the vias 78 are removed after an excessive amount of vias 78 have been added. As illustrated in FIG. 18, a portion of the vias 78 are removed from the via insertion allowable region 76 (FIG. 17) in which an excessive amount of vias 78 had been set.

When removing the portion of vias 78 in step 258, it is preferable that vias 78 are added or removed equally in the via insertion allowable region 76. Specifically, it is preferable that the arrangement of the vias 78 in the via insertion allowable region 76 is balanced so that regions containing the vias 78 do not become unbalanced in the via insertion allowable region 76. For example, cutout regions 70 that have been excessively added are removed in equal intervals in step 258. A number obtained by the equation $\{D/(D-Z)\}$ may be set as cutout intervals as an example of an equal interval.

The following is an explanation of a simulation result of warp in the circuit board 64 when a correction process is executed by the board design aid device 10 realized by the computer 30 on the circuit board 64.

Figure 19:
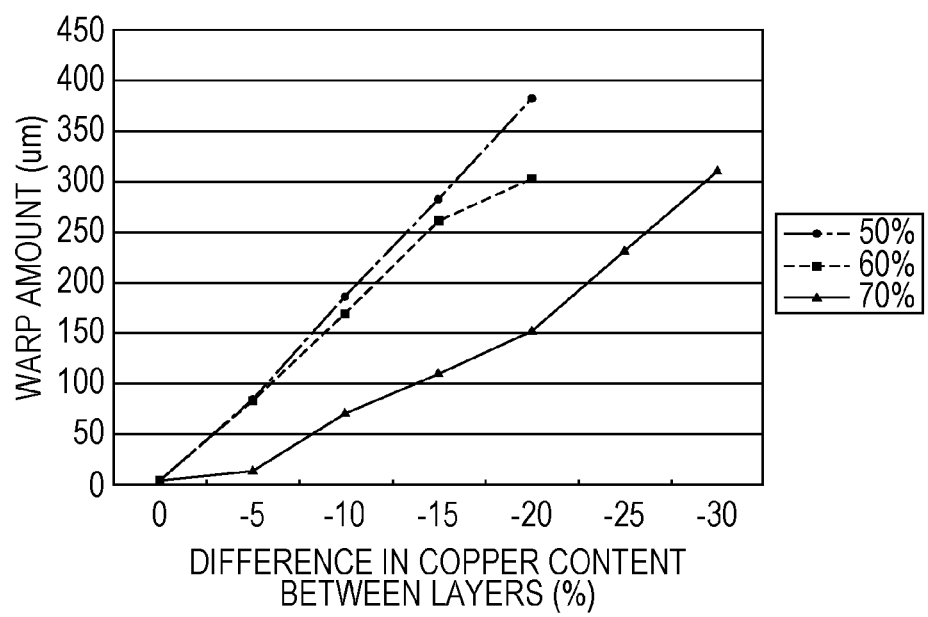
FIG. 19 describes an example of processing results when a circuit board is corrected.

FIG. 19 illustrates an example of a processing result of the board design aid device 10 according to the present embodiment when circuit board design information is corrected so that the copper content in a layer pair has symmetry. The warp amount increases in correspondence to an increase in a difference of copper content in the layer pair. However, an improvement in warp amount may be confirmed in accordance with a correction in a downward trend of the difference of copper content. In FIG. 19, a reduction of 50% in the difference in copper content is represented by the dot-and-dash line, a reduction of 60% is represented by the dotted line, and a reduction of 70% is represented by the solid line.

Figure 21:
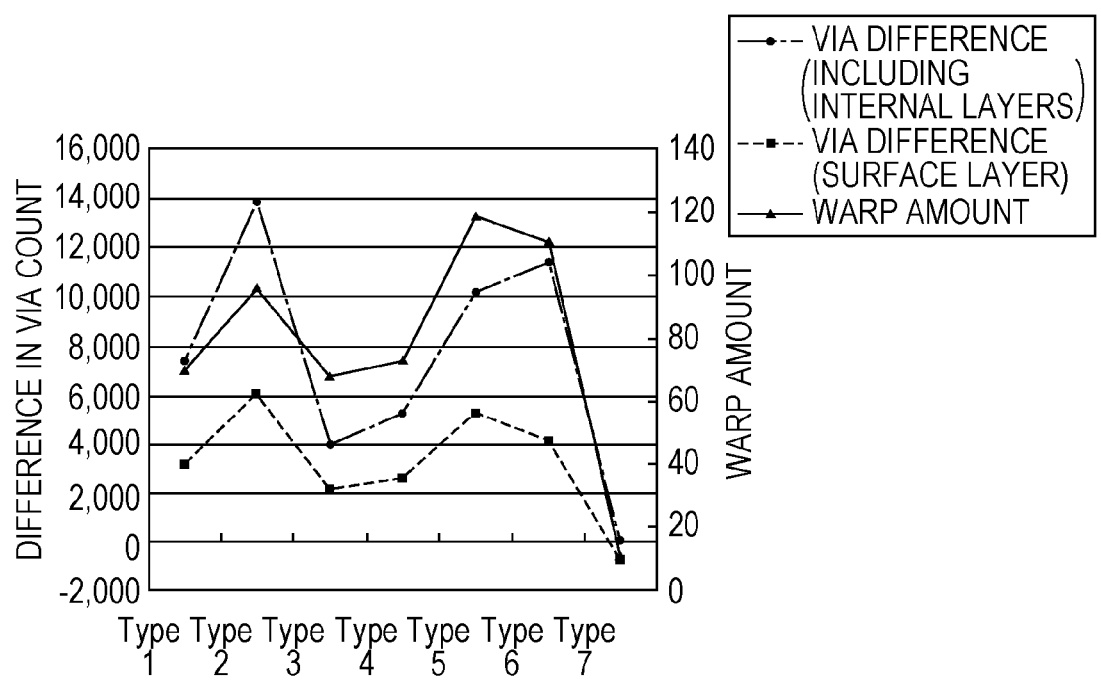
FIG. 21 is an image of an example of a relationship between via count differences and warp amounts in circuit boards.

FIG. 20 illustrates vias counts between layers in seven types of circuit boards 64. FIG. 21 illustrates a relationship between via count differences and warp amount in the seven types of circuit boards 64. As illustrated in FIG. 21, an improvement in warp amount may be confirmed due to a reduction in the via count difference between layers.

As described above, a plurality of layer pairs are grouped in the circuit board 64 and the difference between the copper contents and the via counts in relationship to the warp of the circuit board 64 is derived between the layer pairs based on the design information 12 of the circuit board 64. The copper content and the via count are corrected in at least one of the layers of the layer pair so as to reduce the derived difference. Consequently, warp of the circuit board 64 may be reduced.

The above describes examples in which the board design aid device 10 is realized by the computer 30. However, the above description is not limited as such and various modifications or improvements may be made within the scope described above.

Moreover, while the program has been described as being stored (installed) beforehand in the storage unit, the present embodiment is not limited as such. For example, the program of the disclosed technique may be provided in the form of being recorded on a recording medium such as a CD-ROM or a DVD-ROM.

All documents, patent applications, and technical standards described herein are incorporated by reference in the present specification to the same degree as when individual documents, patent applications, and technical standards are incorporated by reference specifically and individually.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A board design aid device comprising:
    a calculating unit that groups a plurality of layers in a multi-layer board into a plurality of pairs of layers based on design information of the multi-layer board, the plurality of layers being stacked and derives a difference of total amounts in respect to a board design element, each of the total amounts being related to each layer of a pair of layers of the plurality of pairs of layers, the board design element being related to a warp of the multi-layer board; and
    a correcting unit that, based on the difference of the total amounts, corrects an amount of the board design element for at least one of layers among at least one of the plurality of the pairs of layers so that the difference of the total amounts of the board design element is maintained within a certain range.

2. The board design aid device according to claim 1, wherein
    the multi-layer board is a circuit board, and
    the calculating unit groups two layers disposed at symmetric positions in relation to the center of the multi-layer board, into the pair of layers.

3. The board design aid device according to claim 1, wherein
    the multi-layer board is a circuit board and the board design element is an electrical conductor element; and
    the correcting unit corrects an amount of the electrical conductor element in the at least one of the layers.

4. The board design aid device according to claim 3, wherein
    the correcting unit corrects the amount of the electrical conductor element so that the electrical conductor element are distributed equally in the at least one of the layers.

5. The board design aid device according to claim 1, wherein
    the calculating unit includes,
        an analyzing unit that, based on the design information of the multi-layer board, estimates the warp of the multi-layer board, and
        a deriving unit that determines, as a region for correction, the region in which the warp of the multi-layer board estimated by the analyzing unit exceeds a certain value, and that derives the difference in the total amounts in each of regions responsive to the region, each of the regions being in each layer of one of the plurality of pairs of layers.

6. The board design aid device according to claim 5, wherein
    the analyzing unit obtains information indicating an actual measurement value related to displacement of a component mounted on the multi-layer board from a storage unit that stores the information indicating the actual measurement value of the component, and estimates the warp of the multi-layer board by using the obtained information indicating the actual measurement value of the component.

7. The board design aid device according to claim 1, further comprising:

a display unit that displays at least one of information indicating a calculation result of the calculating unit and information indicating a correction result of the correcting unit.

8. A board design aid method comprising:
    grouping a plurality of layers in a multi-layer board having a plurality of layers stacked therein into a plurality of pairs of layers based on design information of the multi-layer board, and deriving a difference of total amounts in respect to a board design element, each of the total amounts being related to each layer of a pair of layers of the plurality of pairs of layers, the board design element being related to a warp of the multi-layer board; and
    correcting, based on the difference of the total amounts, an amount of the board design element for at least one of layers among at least one of the plurality of the pairs of layers so that the difference of the total amounts of the board design element is maintained within a certain range.

9. The board design aid method according to claim 8, wherein the multi-layer board is a circuit board, and
    the grouping is configured to group two layers disposed at symmetric positions in relation to the center of the multi-layer board, into the pair of layers.

10. The board design aid method according to claim 8, wherein the multi-layer board is a circuit board and the board design element is an electrical conductor element, and the method further comprises:
    correcting an amount of the electrical conductor element in the at least one of the layers when correcting an amount of the prescribed board design elements.

11. The board design aid method according to claim 10, further comprising:
    correcting an amount of the electrical conductor element so that the electrical conductor element are distributed equally in the at least one of the layers when correcting an amount of the prescribed board design elements.

12. The board design aid method according to claim 8, further comprising:
    based on the design information of the multi-layer board, estimating the warp of the multi-layer board, prescribing a region in which the estimated warp of the multi-layer board exceeds a prescribed value as a region for correction, and deriving a difference in total amounts of a prescribed board design element related to the warp of the multi-layer board in each of the regions for correction in the plurality of pairs of layers.

13. The board design aid method according to claim 12, further comprising:
    obtaining information indicating an actual measurement value related to displacement of a component mounted on the multi-layer board from a storage unit that stores the information indicating the actual measurement value of the component, and estimating the warp of the multi-layer board by using the obtained information indicating the actual measurement value of the component.

14. The board design aid method according to claim 8, further comprising:
    displaying information of at least one of information indicating a difference in the total amount of the prescribed board design element and information indicating an amount of the prescribed board design elements to be corrected.

15. A computer-readable recording medium having stored therein a program for causing a computer to execute a process, the process comprising:

grouping a plurality of layers in a multi-layer board having a plurality of layers stacked therein into a plurality of pairs of layers based on design information of the multi-layer board, and deriving a difference of total amounts in respect to a board design element, each of the total amounts being related to each layer of a pair of layers of the plurality of pairs of layers, the board design element being related to a warp of the multi-layer board; and correcting, based on the difference of the total amounts, an amount of the board design element for at least one of layers among at least one of the plurality of the pairs of layers so that the difference of the total amounts of the board design element is maintained within a certain range.

16. The computer-readable recording medium having stored therein a program for causing a computer to execute a process according to claim 15, wherein the multi-layer board is a circuit board, and the grouping is configured to group two layers disposed at symmetric positions in relation to the center of the multi-layer board, into the pair of layers.

17. The computer-readable recording medium having stored therein a program for causing a computer to execute a process according to claim 15, wherein the multi-layer board is a circuit board and the board design element is a electrical conductor element, the program further causing a computer to execute a process including:

correcting an amount of the electrical conductor element in the at least one of the layers when correcting an amount of the board design elements.

18. The computer-readable recording medium having stored therein a program for causing a computer to execute a process according to claim 17, further causing a computer to execute a process including:

correcting an amount of the electrical conductor element so that the electrical conductor element is distributed equally in the at least one of the layers when correcting an amount of the board design elements.

19. The computer-readable recording medium having stored therein a program for causing a computer to execute a process according to claim 15, further causing a computer to execute a process including:

based on the design information of the multi-layer board, estimating the warp of the multi-layer board, prescribing a region in which the estimated warp of the multi-layer board exceeds a prescribed value as a region for correction, and deriving a difference in total amounts of a board design element related to the warp of the multi-layer board in each of the regions for correction in the plurality of pairs of layers.

20. The computer-readable recording medium having stored therein a program for causing a computer to execute a process according to claim 19, further causing a computer to execute a process including:

obtaining information indicating an actual measurement value related to displacement of a component mounted on the multi-layer board from a storage unit that stores the information indicating the actual measurement value of the component, and estimating the warp of the multi-layer board by using the obtained information indicating the actual measurement value of the component.

* * * * *